(12) United States Patent
Yoon et al.

(10) Patent No.: US 7,964,877 B2
(45) Date of Patent: Jun. 21, 2011

(54) POLARIZED SEMICONDUCTOR LIGHT EMITTING DEVICE WITH LIGHT GUIDING PORTIONS FORMED WITHIN

(75) Inventors: Sang Ho Yoon, Gyunggi-do (KR); Su Yeol Lee, Gyunggi-do (KR); Dae Yeon Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 147 days.

(21) Appl. No.: 11/822,186

(22) Filed: Jul. 3, 2007

(65) Prior Publication Data

US 2008/0012028 A1  Jan. 17, 2008

(30) Foreign Application Priority Data

Jul. 3, 2006 (KR) .................. 10-2006-0061789

(51) Int. Cl.
*H01L 33/00* (2010.01)
(52) U.S. Cl. .............. 257/79; 257/98; 257/E33.005; 257/E33.068
(58) Field of Classification Search ........... 257/98, 257/E33.005, E33.068, 79
See application file for complete search history.

(56) References Cited

U.S. PATENT DOCUMENTS

| | | | | |
|---|---|---|---|---|
| 5,779,924 | A * | 7/1998 | Krames et al. | 216/24 |
| 7,262,550 | B2 * | 8/2007 | Erchak et al. | 313/498 |
| 2002/0018620 | A1 * | 2/2002 | Koyama et al. | 385/37 |
| 2003/1016025 | | 8/2003 | Bader et al. | |
| 2004/0142503 | A1 * | 7/2004 | Lee et al. | 438/47 |
| 2006/0027815 | A1 | 2/2006 | Wierer, Jr. et al. | |
| 2006/0222040 | A1 | 10/2006 | Schmid et al. | |

FOREIGN PATENT DOCUMENTS

| | | |
|---|---|---|
| JP | 05-275739 | 10/1993 |
| JP | 11-274568 | 10/1999 |
| JP | 2002-164574 | 6/2002 |
| JP | 2003-273399 | 9/2003 |
| JP | 2003-298183 | 10/2003 |
| JP | 2004-289096 | 10/2004 |
| JP | 2005-093988 | 4/2005 |
| JP | 2005-129939 | 5/2005 |
| JP | 2005-353623 | 12/2005 |
| JP | 2006-157024 | 6/2006 |
| KR | 1020050049066 A | 5/2005 |
| KR | 10-2005-0072640 | 7/2005 |

OTHER PUBLICATIONS

Japanese Notice of Office Action, with English Translation, issued in Japanese Patent Application No. 2007-156212, dated Jan. 18, 2011.

* cited by examiner

*Primary Examiner* — Hung Vu
*Assistant Examiner* — Vernon P Webb
(74) *Attorney, Agent, or Firm* — McDermott Will & Emery LLP

(57) ABSTRACT

A polarized semiconductor light emitting device includes a semiconductor structure having a first conductivity semiconductor layer, an active layer and a second conductivity semiconductor layer sequentially stacked. Also, the semiconductor structure further includes a plurality of light guide parts defined by a plurality of grooves arranged along a predetermined direction. The grooves extend from the second conductivity semiconductor layer with a depth reaching at least the active layer, and the light guide parts have a length greater than a width thereof to selectively emit a polarized component in a length direction thereof.

16 Claims, 5 Drawing Sheets

(a)

(b)

POLARIZED SEMICONDUCTOR LIGHT EMITTING DEVICE WITH LIGHT GUIDING PORTIONS FORMED WITHIN

CLAIM OF PRIORITY

This application claims the benefit of Korean Patent Application No. 2006-61789 filed on Jul. 3, 2006 in the Korean Intellectual Property Office, the disclosure of which is incorporated herein by reference.

BACKGROUND OF THE INVENTION

1. Field of the Invention

The present invention relates to a polarized semiconductor device, more particularly, which adopts a light guide structure with a principle similar to that of a photo crystal structure to relatively enhance effects of emitting specific polarized components.

2. Description of the Related Art

Recently, planar display technologies mainly about liquid crystal displays (LCDs) and plasma display panels (PDPs) have seen a rapid development. With a larger size in the display, a light source and optical materials account for a very significant proportion in costs. The large-sized display also causes the light source to consume considerable power.

Especially, in a liquid crystal display (LCD), a plurality of optical sheets should be adopted to ensure light to be diffused uniformly. This undermines light efficiency of a backlight unit (BLU) and increases manufacturing costs. In a method to overcome this problem, studies have been actively conducted on a method for utilizing a light emitting diode (LED) as the light source to enhance color reproducibility and response rate of the LCD.

FIG. 1 is an exploded view illustrating a conventional backlight unit employing an LED light source.

The backlight device of FIG. 1 includes the LED light source 2, a light guide plate 4, a diffusing sheet 5, a prism sheet unit composed of first and second prism sheets 6a and 6b, and a polarization plate 7.

As shown in FIGS. 2a and 2b, the LED light source 2 for general use in the backlight unit includes a light emitting structure having a first conductivity semiconductor layer 14 and 24, an active layer 16 and 26 and a second conductivity semiconductor layer 18 and 28 sequentially formed on a substrate 11 and 21, and first and second electrodes 19a and 19b; 29a and 29b electrically connected to the first and second conductivity semiconductor layers, respectively.

Light generated from the LED light source 2 propagates toward the diffusing sheet through the light guide plate 2. The light diffused by the diffusing sheet 5 is directed toward a liquid crystal panel (not illustrated) which is typically disposed above a protective sheet 17 through the first and second prism sheets 6a and 6b and the polarization plate 7.

Here, the diffusing sheet 5 ensures light to be emitted with uniform brightness onto an overall area, and the prism sheet unit 6 serves to enhance brightness of light within a specific view angle range. Also, the polarization plate 7 selectively transmits a specific polarized component. As described above, the backlight unit requires the various optical sheets to convert a point light source such as the LED into a bright and uniform surface light source across the screen.

Preferably, a specific optical sheet can be replaced with another conventional element such as the light source to reduce manufacturing costs, improve a manufacturing process of the backlight unit, and enhance light efficiency. Especially, a light source designed to selectively emit a specific polarized component can obviate a need for the polarization plate. This accordingly lowers costs attendant thereto and prevents light loss associated with selection of the polarized component. In this respect, the polarized light source can be very beneficially employed as the backlight light source.

However, in general, the LED light source 2 has polarized components in all directions, thereby necessitating a polarization plate for a desired polarized component. This consequently increases manufacturing costs and degrades light efficiency.

SUMMARY OF THE INVENTION

The present invention has been made to solve the foregoing problems of the prior art and therefore an aspect of the present invention is to provide an LED light source which is polarized to selectively emit a polarized component in a specific direction, and adopts a resonance structure to compensate for degradation in effective light efficiency resulting from increased polarization, thereby improving light directivity.

According to an aspect of the invention, the semiconductor light emitting device includes a semiconductor structure including a first conductivity semiconductor layer, an active layer and a second conductivity semiconductor layer sequentially stacked, wherein the semiconductor structure further includes a plurality of light guide parts defined by a plurality of grooves arranged along a predetermined direction, the grooves extending from the second conductivity semiconductor layer with a depth reaching at least the active layer, and the light guide parts having a length greater than a width thereof to selectively emit a polarized component in a length direction thereof.

Preferably, the light guide parts have the length that is at least three times the width thereof. This allows the selected polarized component to be more emitted.

Considering etching, e.g., laser beam diffraction, for forming the grooves, the light guide parts may be formed periodically.

The light guide parts and the grooves of the invention can function as a photonic crystal structure, corresponding to first and second media, respectively. In this structure, the grooves are filled with a material having a refractivity lower than that of the semiconductor structure. This allows the light guide parts and the grooves to operate as the photonic crystal structure.

In a detailed embodiment of the invention, the semiconductor structure of the invention can be adopted as both planar and vertical light emitting devices.

According to an embodiment of the invention, the planar semiconductor light emitting device further includes an insulating substrate having the first conductivity semiconductor layer, the active layer and the second conductivity semiconductor layer sequentially stacked thereon, wherein the semiconductor structure is mesa-etched to expose a portion of the first conductivity semiconductor layer, and further includes a first electrode formed on an exposed portion of the first conductivity semiconductor layer and a second electrode formed on a portion of the second conductivity semiconductor layer.

Preferably, each of the grooves is extended toward the first electrode from a position adjacent to the second electrode.

According to another embodiment of the invention, the semiconductor light emitting device further includes a conductive substrate having the second semiconductor layer, the active layer and the first conductivity semiconductor layer sequentially stacked thereon; a first electrode formed on a portion of the first conductivity substrate; and a second electrode formed underneath the conductive substrate.

Here, the grooves are extended from an edge of the semiconductor structure to an opposing edge thereof.

The light guide parts of the invention may be arranged two-dimensionally. To this end, the grooves are arranged in at least two rows. Preferably, the light guide parts are connected with one another by the second conductivity layer. This enables light to be emitted in the second semiconductor layer, from the entire active layer through one electrode.

According to the invention, a resonance structure may be additionally employed to improve directivity of light.

According to a preferred embodiment of the invention, the semiconductor structure includes first and second reflective layers having the active layer interposed therebetween, the first and second reflective layers formed at an interval corresponding to natural number times a half wavelength of light generated from the active layer, and the second reflective layer is disposed in a light exiting direction and the second reflective layer has a lower refractivity for a wavelength of light generated from the active layer than that generated from the first reflective layer.

Preferably, the first reflective layer has at least 80% reflectivity for the wavelength of light generated from the active layer, and the second reflective layer has 20% to 60% reflectivity for the wavelength of light generated from the active layer.

According to the embodiment of the invention, the resonance structure can be varied depending on the structure of the LED.

The semiconductor light emitting device may further include an insulating substrate having the first conductivity semiconductor layer, the active layer and the second conductivity semiconductor layer sequentially stacked thereon, wherein the second reflective layer is disposed on the second conductivity semiconductor layer, and the first reflective layer is disposed inside the first conductivity semiconductor layer.

Moreover, the semiconductor light emitting device may further include a conductive substrate having the second conductivity semiconductor layer, the active layer and the first conductivity semiconductor layer sequentially stacked thereon, wherein the first reflective layer is disposed inside the first conductivity semiconductor layer, and the second reflective layer comprises the conductive substrate or a metal reflective layer interposed between the conductive substrate and the first conductivity semiconductor layer.

In this embodiment of the invention, the first reflective layer may adopt a Distributed-Bragg Reflector (DBR) structure in which semiconductor layers of different refractivity are stacked alternately at least once.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
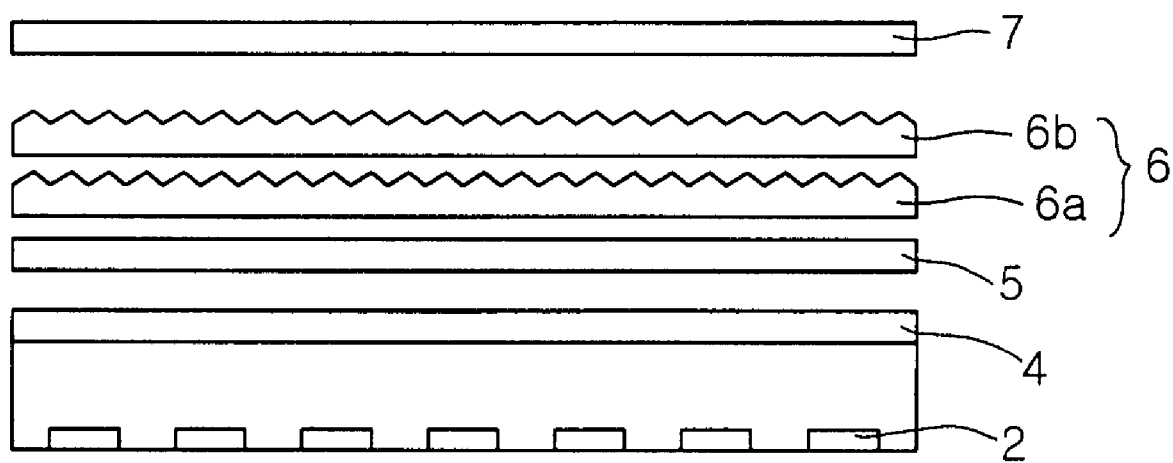
FIG. 1 is an exploded cross-sectional view illustrating a conventional backlight structure.
Figure 2:
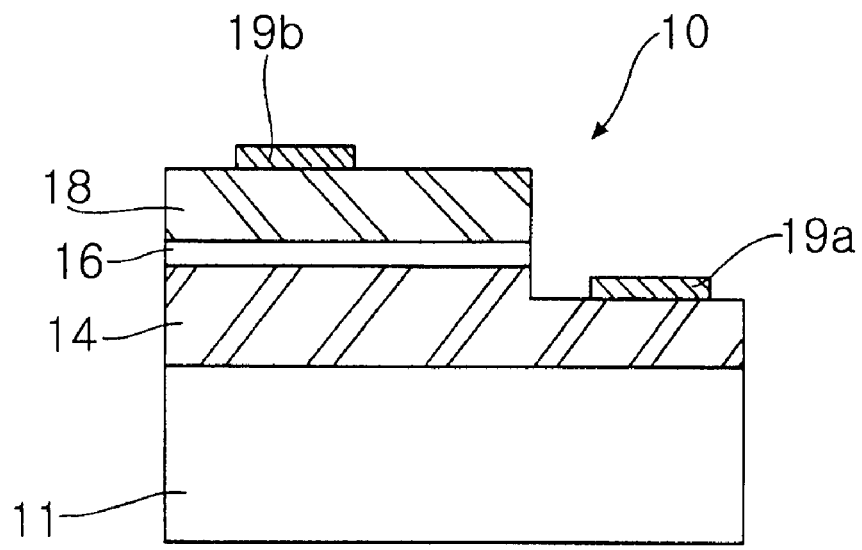
FIGS. 2a and 2b are cross-sectional views illustrating a conventional semiconductor device.
Figure 2:
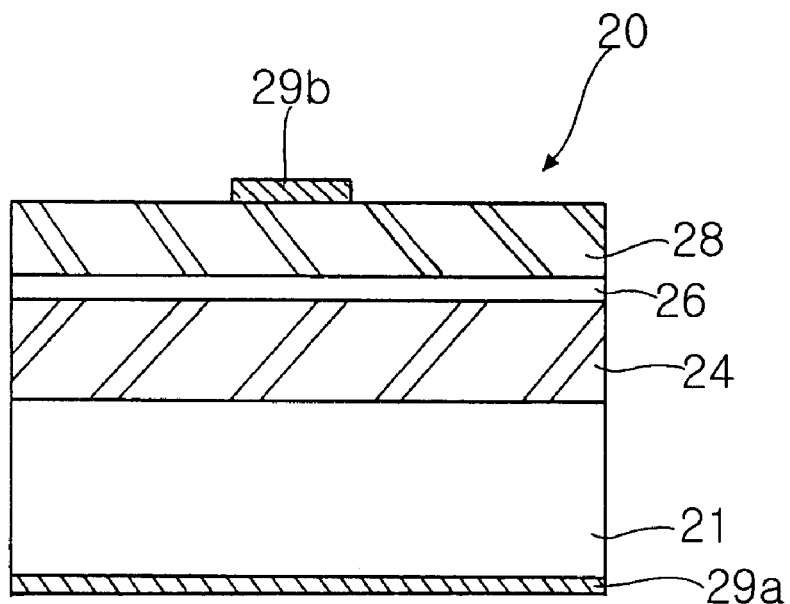
Figure 3:
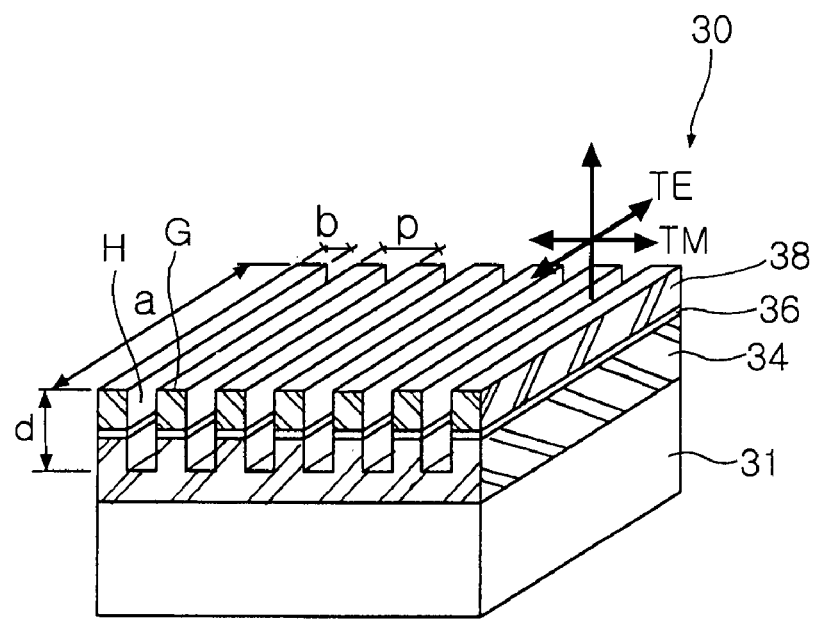
FIG. 3 is a perspective view illustrating a structure of a semiconductor light emitting device for explaining a light guide structure according to the invention.

FIG. 3 is a perspective view illustrating a semiconductor light emitting device for explaining a light guide structure according to the invention. Here, for a clearer explanation of a light emitting structure of the light guide structure, an electrode is omitted.

FIG. 3 illustrates a semiconductor light emitting structure 30 having a first conductivity semiconductor layer 34, an active layer 36 and a second conductivity semiconductor layer 38 sequentially formed on a substrate 31.

A plurality of grooves H are arranged in parallel along a predetermined direction to extend from the second conductivity semiconductor layer 38 with a depth reaching at least the active layer 36. The depth of the grooves H would be sufficient if the grooves H could divide the active layer 36. These grooves H define a plurality of light guide parts G having a length a greater than a width b thereof in the semiconductor light emitting structure 30. Preferably, the length a of the light guide parts G is at least three times the width a thereof to allow light of a desired polarized component to be more emitted than other polarized components.

The light guide parts G and grooves H are considered as separate media having different refractivities, that is, the refractivity of the semiconductor crystal and the refractivity of the air, respectively. Therefore, the light guide parts G and the grooves H alternating with each other function similarly to a photonic crystal structure, thereby selectively emitting only a specific polarized component.

In the light emitting structure as shown in FIG. 3, light generated from the active layer 36 has polarized components from all directions. However, a polarized component, e.g., TM corresponding to a width direction of the light guide parts G and the grooves H alternating with each other, is suppressed. Meanwhile, only a polarized component, e.g., TE corresponding to a length direction of the light guide parts G is selectively emitted. Of course, other polarized component can be obtained depending on the direction of the grooves, i.e., the length direction of the light guide parts G.

The pattern constructed of the light guide parts G and the grooves H can be formed by an etching process such as laser beam diffraction or electronic beam lithography. The etching can be conducted such that the pattern has a period p satisfying the following Equation 1.

$$p = m \cdot \frac{\lambda}{2n_{eq}},$$ Equation 1 where m is a natural number, λ is a wavelength of light generated from an active layer and $n_{eq}$ is an effective refractivity of a semiconductor layer. Also, the grooves H can be filled with an insulating material having a different refractivity, which may alter characteristics of the photonic crystal structure.

The invention can be beneficially applicable to a planar light emitting device which is flip-chip bonded and a vertical light emitting device as well.

Figure 4:
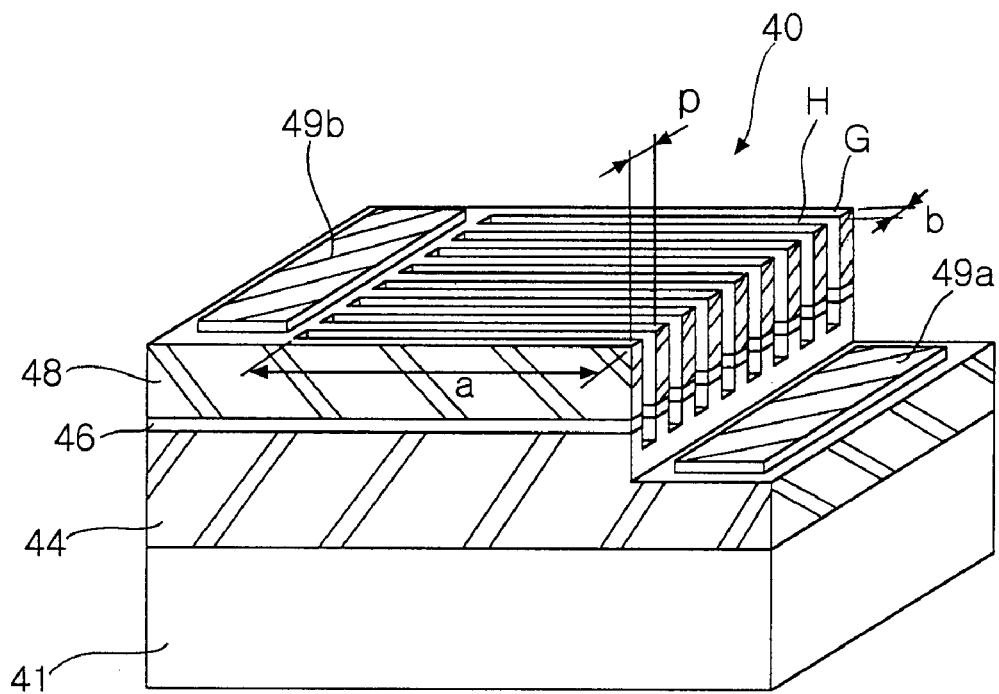
FIG. 4 is a perspective view illustrating a semiconductor light emitting device according to an embodiment of the invention.
Figure 5:
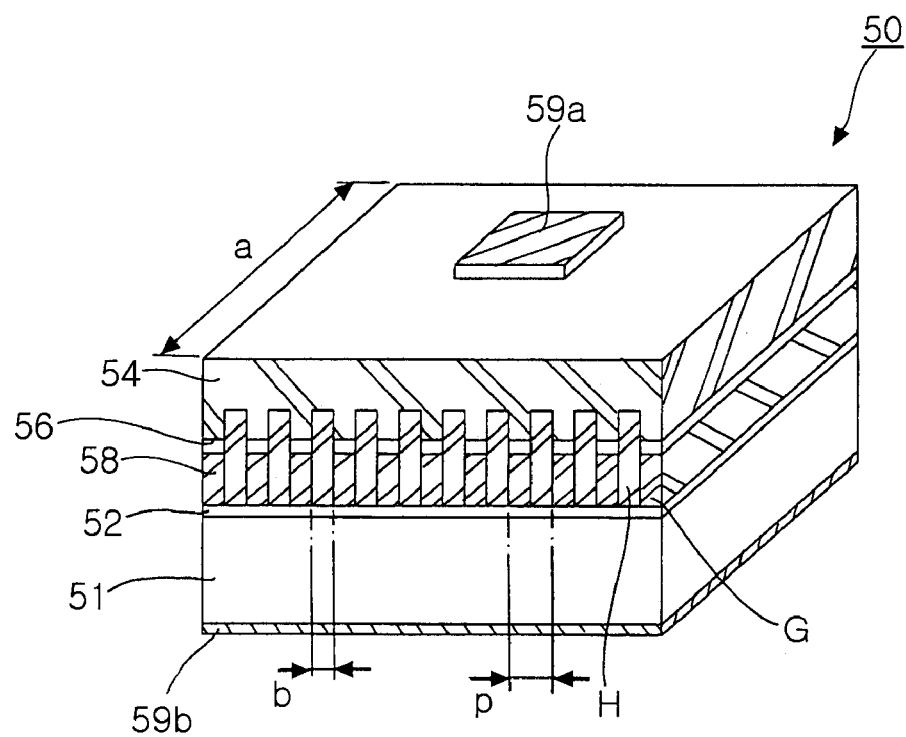
FIG. 5 is a perspective view illustrating a semiconductor light emitting device according to another embodiment of the invention.

FIG. 4 illustrates a planar light emitting device according to a detailed embodiment of the invention and FIG. 5 illustrates a vertical light emitting device according to a detailed embodiment of the invention.

First, as shown in FIG. 4, the light emitting device 40 includes a first conductivity semiconductor layer 44, an active layer 46, and a second conductivity semiconductor layer 48 sequentially formed on a substrate 41. Also, the light emitting device 40 includes first and second electrodes connected to the first and second semiconductor layers 44 and 48, respectively.

In this embodiment, the substrate 41 is made of an insulating material such as sapphire, and thus mesa-etched to expose a portion of the first conductivity semiconductor layer 44. In this structure, the first electrode 49a is formed on an exposed portion of the first conductivity semiconductor layer 44 and the second electrode 49b is formed on a portion of the second conductivity semiconductor layer 48.

Moreover, in the semiconductor light emitting structure, a plurality of grooves H define a plurality of light guide parts G having a length a greater than a width thereof. Preferably, as shown in FIG. 3, each of the grooves G is extended toward the first electrode 49a from a position adjacent to the second electrode 49b to prevent an interruption in the active layer 46 between the first and second electrodes 49a and 49b. As described above, the light guide parts G and the grooves H alternating with each other can function as a photonic crystal structure in which a specific polarized component is more emitted.

FIG. 5 is a perspective view illustrating a semiconductor light emitting device according to another embodiment of the invention.

FIG. 5 illustrate a semiconductor light emitting device 50 including a second conductivity semiconductor layer 58, an active layer 56 and a first conductivity semiconductor layer 56 sequentially formed on a substrate 51.

In this embodiment, the substrate 51 may be a conductive substrate. The first electrode 59a is formed on a portion of the first conductivity semiconductor layer 54 and the second electrode 59b is formed underneath the conductive substrate 51, thereby electrically connected to the first and second semiconductor layers 54 and 58, respectively. To form the vertical light emitting device 50, the first conductivity semiconductor layer 54, the active layer 56 and the second conductivity semiconductor layer 58 are sequentially stacked on a base substrate, and the stack of semiconductor crystal layers is separated from the base substrate and then bonded onto the conductive substrate 51. As shown in FIG. 5, in this bonding process, a metal reflective layer 52 can be additionally disposed between the second conductivity semiconductor layer 58 and the conductive substrate 51 to improve light extraction efficiency.

In this process, the grooves H may be formed after forming the semiconductor light emitting structure on the base substrate (not illustrated) but before bonding the semiconductor light emitting structure onto the conductive substrate 51. In this fashion, the grooves H are formed in an area where the electrodes are not formed so that the grooves H and light guide parts G can be located in a sufficiently larger area irrespective of the location of the electrodes as shown in FIG. 4. Therefore, the grooves H can be extended from an edge of the semiconductor structure to an opposing edge thereof, allowing the light guide parts G to be formed longer. This accordingly further enhances polarization.

In this embodiment described above, the grooves H are arranged in parallel along a predetermined direction to form a one-dimensional photonic crystal structure. Alternatively, the grooves can be arranged in at least two rows to form a two-dimensional photonic crystal structure.

Figure 6:
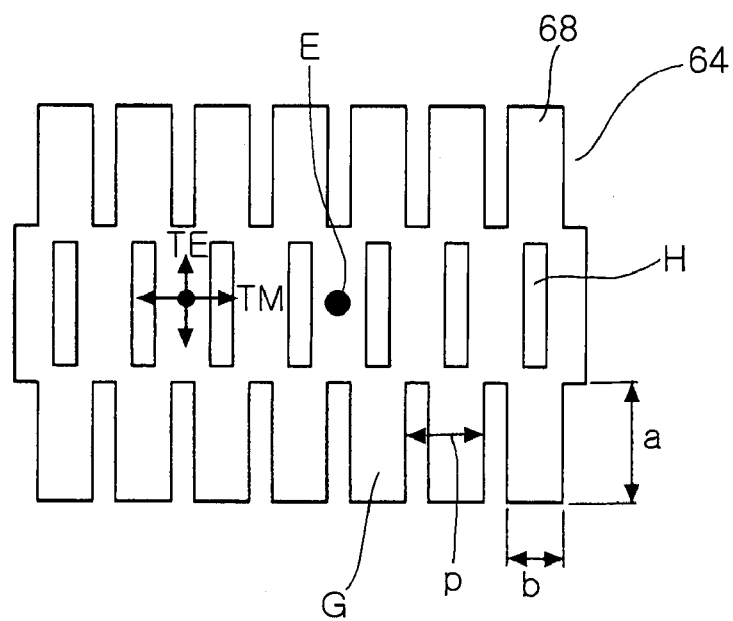
FIG. 6 is a plan view illustrating a photonic crystal structure with two-dimensional periodicity which is applicable to a light emitting device of the invention.

FIG. 6 is a plan view illustrating a photonic crystal structure with a two-dimensional period applicable to a semiconductor light emitting device of the invention. The plane of FIG. 6 corresponds to one surface of the semiconductor light emitting structure, e.g., the second conductivity semiconductor layer shown in FIGS. 4 and 5.

As shown in FIG. 6, a plurality of grooves H define light guide parts G having a length a greater than a width b thereof. The grooves H are arranged in parallel in three rows. This produces a two-dimensional photonic crystal structure.

Also, the grooves H arranged in three rows are spaced apart from one another so that the light guide parts G are connected with one another by the second conductivity semiconductor layer 68. Since the remaining areas of the light guide parts G are connected with one another, the entire active layer area can be driven by an electrode provided in a portion E of the second conductivity semiconductor layer 68. This is greatly beneficial for implementing a two-dimensional photonic crystal structure in the planar light emitting device shown in FIG. 4.

Another aspect of the invention is to improve directivity of light in order to enhance light efficiency decreased in compensation for better polarization. Especially, the semiconductor light emitting device itself is purportedly very low in light efficiency in a desired direction since light is extracted in a forward direction. Also, according to the invention, the polarized light emitting device experiences loss in a specific polarized component, thus reduced in light efficiency. Meanwhile, when more light is emitted in different directions, the light emitting device is degraded in polarization efficiency itself.

Figure 7:
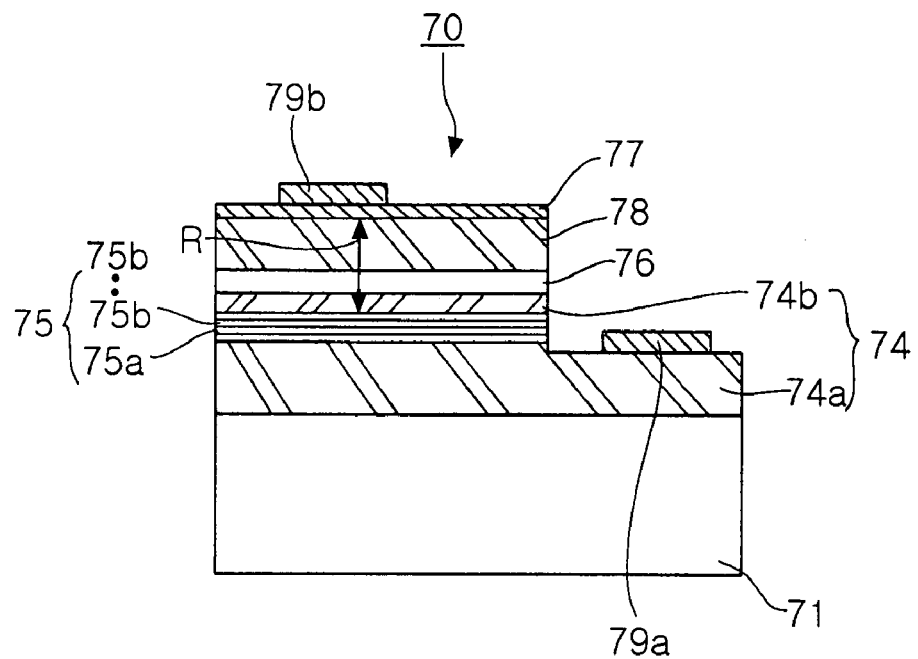
FIG. 7 is a cross-sectional view illustrating a semiconductor light emitting device improved in directivity according to a preferred embodiment of the invention.
Figure 8:
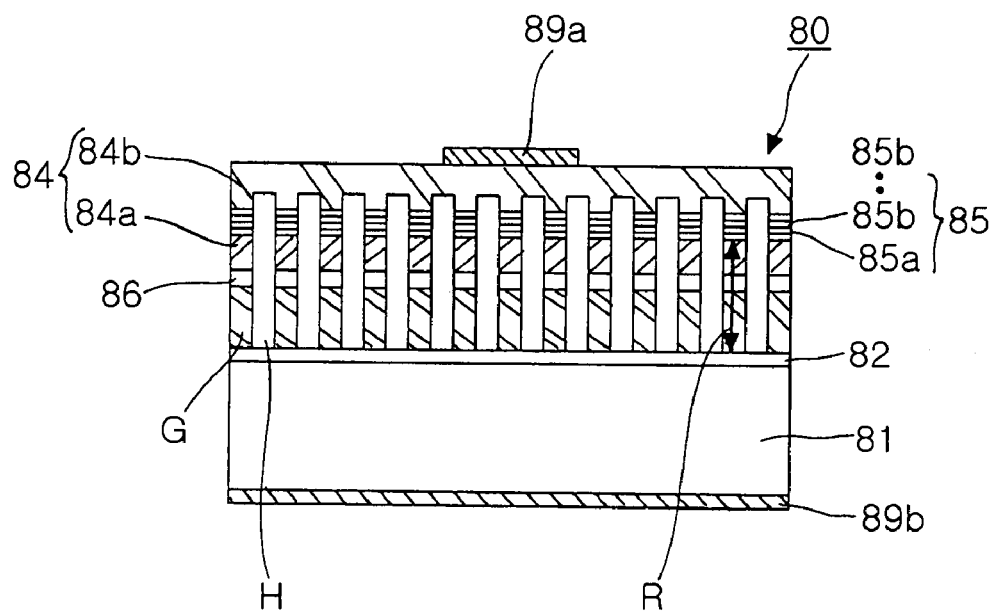
FIG. 8 is a perspective view illustrating a vertical semiconductor light emitting device according to further another embodiment of the invention.

As a result, as shown in FIGS. 7 and 8, a resonance structure improved in directivity is combined with a photo crystal structure to allow light to exit only through a top surface of a light emitting structure, thereby maximizing polarization effects from the photonic crystal.

FIG. 7 is a cross-sectional view illustrating a semiconductor light emitting device improved in directivity according to a preferred embodiment of the invention.

As shown in FIG. 7, the light emitting device 70 according to the invention includes a first conductivity semiconductor layer 74, an active layer 76 and a second conductivity semiconductor layer 78 sequentially formed on a substrate 71. Also, the light emitting device 70 includes first and second electrodes 79a and 79b connected to the first and second conductivity semiconductor layers 74 and 78, respectively.

Although not illustrated in FIG. 7, similarly to the LED shown in FIG. 4, in the semiconductor light emitting structure, a plurality of grooves are considered to define a plurality of light guide parts having a length greater than a width thereof.

The light emitting device 70 according to this embodiment includes first and second reflective layers 75 and 77 having an active layer 76 interposed therebetween and formed at an interval corresponding to natural number times a half wavelength of light generated from the active layer 76. The second reflective layer 77 is located in a light exiting direction. The second reflective layer 77 has a low reflectivity for a wavelength of light generated from the active layer 76 than that generated from the first reflective layer 75. Thus, the first and second reflective layers 75 and 77 are defined as a resonance structure R for light generated from the active layer 76. Preferably, the first reflective layer 75 has at least 80% reflectivity for the wavelength of light generated from the active layer 76. The second reflective layer 77 may have 20% to 60% reflectivity for the wavelength of light generated from the active layer 76.

As in this embodiment, the second reflective layer 77, when disposed on the second conductivity semiconductor layer 78, may be made of a reflective material such as a metal or a metal oxide irrespective of a crystal growth process. On the other hand, the first reflective layer 75 is disposed inside the first conductivity semiconductor layer 74. In this case, the first reflective layer 77 can be formed after forming a portion 74a of the first conductivity semiconductor layer but before forming the other portion 74b of the first conductivity semiconductor layer. This requires the first reflective layer 75 to have proper crystallinity.

Therefore, here, preferably, the first reflective layer 75 adopts a Distributed-Bragg Reflector (DBR) structure in which two types of semiconductor crystal films 75a and 75b with different refractivity are stacked alternately at least once. For example, in the case of the nitride light emitting device, an Al component in an AlGaInN nitride semiconductor is adjusted to obtain a desired DBR structure.

FIG. 8 is a perspective view illustrating a vertical semiconductor light emitting device according to another embodiment of the invention.

As shown in FIG. 8, the semiconductor light emitting device 80 of this embodiment includes a first conductivity semiconductor layer 84, an active layer 86 and a second conductivity semiconductor layer 88 sequentially formed on a conductive substrate 81. A first electrode 89a is formed on a portion of the first conductivity semiconductor layer 84 and a second electrode 89b is formed underneath the conductive substrate 81. The first and second electrodes 89a and 89b are electrically connected to the first and second conductivity semiconductor layers 84 and 88, respectively.

In this vertical light emitting device 80, as described above, a plurality of grooves H each may be extended from an edge of the semiconductor structure to an opposing edge thereof to define a plurality of light guide parts G.

Furthermore, the semiconductor light emitting device 80 of this embodiment includes first and second reflective layers 82 and 85 having the active layer 86 interposed therebetween and formed at an interval corresponding to natural number times a half wavelength of light generated from the active layer 86. Here, the second reflective layer 85 has a lower reflectivity than the first reflective layer and thus can be disposed in a light exiting direction.

An area between the first and second reflective layers 82 and 85 is defined as a resonance structure R for light generated from the active layer 86. Preferably, the first reflective layer 82 has at least 80% reflectivity for a wavelength of light generated from the active layer 86. The second reflective layer 87 may have 20% to 60% reflectivity for the wavelength of light generated from the active layer 86.

As in this embodiment, the first reflective layer 82 may be disposed between the second conductivity semiconductor layer 88 and the conductive substrate 81. The first reflective layer 82 can be made of a reflective metal layer. The second reflective layer 85 may be disposed inside the first conductivity semiconductor layer 84 in such a way that the first and second reflective layers are formed at an interval corresponding to natural number times a half wavelength of light generated from the active layer. Here, preferably, the second reflective layer 85 adopts a DBR structure in which two types of semiconductor crystals 85a and 85b with different refractivity are stacked alternately at least once.

As described, in the light emitting device employing the resonance structure through the first and second reflective layers, light may be trapped in the resonance structure along a direction of a photonic crystal structure, i.e., along a length direction of light guide parts. But this problem can be overcome by forming a two-dimensional photonic crystal in which a longer axis and a shorter axis of the light guide parts are adjusted in their length. This accordingly suppresses generation of light in a higher mode.

As set forth above, according to exemplary embodiments of the invention, a semiconductor light emitting device itself can provide a specific polarized component, thereby precluding a need for a polarization plate in a backlight unit. In addition, a resonance structure is adopted to enhance directivity of light, thereby more significantly boosting polarization effects.

While the present invention has been shown and described in connection with the preferred embodiments, it will be apparent to those skilled in the art that modifications and variations can be made without departing from the spirit and scope of the invention as defined by the appended claims.

What is claimed is:

1. A semiconductor light emitting device comprising a semiconductor structure including a first conductivity semiconductor layer, an active layer and a second conductivity semiconductor layer sequentially stacked,
    wherein the semiconductor structure further includes a plurality of grooves extending from the second conductivity semiconductor layer with a depth reaching to at least an inner part of the active layer in order to divide the active layer, and a plurality of light guide parts being separated from each other by each of the plurality of grooves and alternating with the grooves thereof, the light guide parts having a length greater than a width thereof to selectively emit a polarized component in a length direction thereof,
    the grooves are arranged along one direction of the width of the light guide parts,
    the semiconductor structure comprises a first and a second reflective layers, between which the active layer is interposed, and
    the light guide parts and the plurality of grooves are disposed between the first and second reflective layers.

2. The semiconductor light emitting device according to claim 1, wherein the light guide parts have the length that is at least three times the width thereof.

3. The semiconductor light emitting device according to claim 1, wherein the light guide parts are formed periodically.

4. The semiconductor light emitting device according to claim 1, wherein the grooves are filled with a material having a refractivity lower than that of the semiconductor structure.

5. The semiconductor light emitting device according to claim 1, further comprising an insulating substrate having the first conductivity semiconductor layer, the active layer and the second conductivity semiconductor layer sequentially stacked thereon,
    wherein the semiconductor structure is mesa-etched to expose a portion of the first conductivity semiconductor layer, and further includes a first electrode formed on an exposed portion of the first conductivity semiconductor layer and a second electrode formed on a portion of the second conductivity semiconductor layer.

6. The semiconductor light emitting device according to claim 5, wherein each of the grooves is extended toward the first electrode from a position adjacent to the second electrode.

7. The semiconductor light emitting device according to claim 1, further comprising:
 a conductive substrate having the second semiconductor layer, the active layer and the first conductivity semiconductor layer sequentially stacked thereon;
 a first electrode formed on a portion of the first conductivity substrate; and
 a second electrode formed underneath the conductive substrate.

8. The semiconductor light emitting device according to claim 7, wherein the grooves are extended from an edge of the semiconductor structure to an opposing edge thereof.

9. The semiconductor light emitting device according to claim 1, wherein the first and second reflective layers formed at an interval corresponding to natural number times a half wavelength of light generated from the active layer,
 wherein the second reflective layer is disposed in a light exiting direction and the second reflective layer has a lower refractivity for a wavelength of light generated from the active layer than that generated from the first reflective layer.

10. The semiconductor light emitting device according to claim 9, wherein the first reflective layer has at least 80% reflectivity for the wavelength of light generated from the active layer, and the second reflective layer has 20% to 60% reflectivity for the wavelength of light generated from the active layer.

11. The semiconductor light emitting device according to claim 9, further comprising an insulating substrate having the first conductivity semiconductor layer, the active layer and the second conductivity semiconductor layer sequentially stacked thereon,
 wherein the second reflective layer is disposed on the second conductivity semiconductor layer, and the first reflective layer is disposed inside the first conductivity semiconductor layer.

12. The semiconductor light emitting device according to claim 9, further comprising a conductive substrate having the second conductivity semiconductor layer, the active layer and the first conductivity semiconductor layer sequentially stacked thereon,
 wherein the first reflective layer is disposed inside the first conductivity semiconductor layer, and the second reflective layer comprises the conductive substrate or a metal reflective layer interposed between the conductive substrate and the first conductivity semiconductor layer.

13. The semiconductor light emitting device according to claim 11, wherein the first reflective layer comprises a Distributed-Bragg Reflector (DBR) structure in which semiconductor layers of different refractivity are stacked alternately at least once.

14. The semiconductor light emitting device according to claim 10, wherein the first reflective layer comprises a Distributed-Bragg Reflector (DBR) structure in which semiconductor layers of different refractivity are stacked alternately at least once.

15. A semiconductor light emitting device comprising a semiconductor structure including a first conductivity semiconductor layer, an active layer and a second conductivity semiconductor layer sequentially stacked,
 wherein the semiconductor structure further includes:
  a plurality of grooves, the grooves extending from the second conductivity semiconductor layer with a depth reaching to at least an inner part of the active layer in order to divide the active layer, and
  a plurality of light guide parts being separated from each other by each of the plurality of grooves and alternating with the grooves thereof, and
 wherein the grooves are arranged along one direction of the width of the light guide parts,
 the semiconductor structure comprises a first and a second reflective layers, between which the active layer is interposed, and
 the light guide parts and the plurality of grooves are disposed between the first and second reflective layers.

16. A semiconductor light emitting device comprising a semiconductor structure including a first conductivity semiconductor layer, an active layer and a second conductivity semiconductor layer stacked sequentially,
 wherein the semiconductor structure further includes a plurality of grooves extending from the second conductivity semiconductor layer with a depth reaching to at least an inner part of the active layer in order to divide the active layer, and a plurality of light guide parts separated from each other by each of the respective grooves of the plurality of grooves and alternating with the grooves thereof,
 the light guide parts having a length greater than a width thereof to selectively emit a polarized component in a length direction thereof,
 the grooves are arranged along one direction of the width of the light guide parts, and
 a period p of the light guide parts satisfy the following equation, $$p = m \cdot \frac{\lambda}{2n_{eq}}, \quad \text{Equation}$$

wherein m is a natural number, λ is a wavelength of light generated from the active layer and $n_{eq}$ is an effective refractivity of the semiconductor structure.

* * * * *